(12) United States Patent
Ummy

(10) Patent No.: US 11,276,979 B2
(45) Date of Patent: Mar. 15, 2022

(54) FIBER-BASED CONTINUOUS OPTICAL BEAT LASER SOURCE TO GENERATE TERAHERTZ WAVES USING LITHIUM NIOBATE CRYSTAL EMBEDDED IN THE FIBER

(71) Applicant: Muhammad Ali Ummy, New Hyde Park, NY (US)

(72) Inventor: Muhammad Ali Ummy, New Hyde Park, NY (US)

( * ) Notice: Subject to any disclaimer, the term of this patent is extended or adjusted under 35 U.S.C. 154(b) by 189 days.

(21) Appl. No.: 16/555,128

(22) Filed: Aug. 29, 2019

(65) Prior Publication Data

US 2021/0066876 A1 Mar. 4, 2021

(51) Int. Cl.
*H01S 1/02* (2006.01)
*H01S 3/067* (2006.01)
*H01S 3/094* (2006.01)
*H01S 3/16* (2006.01)

(52) U.S. Cl.
CPC ............ *H01S 1/02* (2013.01); *H01S 3/06716* (2013.01); *H01S 3/094003* (2013.01); *H01S 3/094096* (2013.01); *H01S 3/1671* (2013.01)

(58) Field of Classification Search
CPC .. H01S 1/02; H01S 3/06716; H01S 3/094096; H01S 3/094003; H01S 3/1671; H01S 3/1083; H01S 5/0092; H01S 3/1062; H01S 3/0826; H01S 3/1067; H01S 3/10061; H01S 3/083; H01S 3/07; H01S 5/1092; H01S 5/142; H01S 5/4068; H01S 5/146

See application file for complete search history.

(56) References Cited

U.S. PATENT DOCUMENTS 6,501,886 B1 * 12/2002 Rankin .................. G02B 6/125
385/48

OTHER PUBLICATIONS

Yuanxun Ge, Jianjun Cao, Zhenhua Shen, Yuanlin Zheng, Xianfeng Chen and Wenjie Wan, "Terahertz wave generation by plasmonic-enhanced difference-frequency generation", J. Opt. Soc. Am. B, vol. 31, No. 7, Jul. 2014 (Year: 2004).*
E Pickwell and V P Wallace "Biomedical applications of terahertz technology", J. Phys. D: Appl. Phys. 39 R301-R310 (2006).

(Continued)

*Primary Examiner* — Xinning (Tom) Niu
(74) *Attorney, Agent, or Firm* — Nolte Lackenbach Siegel; Myron Greenspan

(57) ABSTRACT

A continuous optical beat laser element for generating terahertz (THz) waves and a laser source using same includes periodically poled lithium niobate (ppLN) crystals arranged along a predetermined direction forming a surface generally parallel to the predetermined direction. A Ti diffused region is applied on the surface and an array of gold nanowires are applied on the Ti diffused region to form a gold metal-insulator-metal (MIM) element that optimizes coupling and channeling of THz radiation from the crystals into the gold nanowires. The system provides a simple, stable, compact and cost-effective THz source using a widely tunable C-band SOA-based laser to excite a non-linear photo-mixer to produce terahertz radiation that ranges from 0.8 to 2.51 THz at room temperature. This laser source can be modified into an all fiber-based THz generator by embedding ppLN crystals in a fiber filament configuration resulting in less absorption and producing high output power.

20 Claims, 17 Drawing Sheets

(56) References Cited

OTHER PUBLICATIONS

Nicholas Karpowicz, Hua Zhong, Cunlin Zhang,a! Kuang-I Lin,b! Jenn-Shyong Hwang,b, Jingzhou Xu, and X.-C. Zhang, "Compact continuous-wave subterahertz system for inspection applications" Applied Physics Letters 86, 054105 (2005).

S. Preu, G. H. Döhler, S. Malzer, L. J. Wang, and A. C. Gossard, "Tunable, continuous-wave Terahertz photomixer sources and applications" J. Appl. Phys. 109, 061301 (2011).

Namje Kim, Jaeheon Shin, Eundeok Sim, Chui Wook Lee, Dae-Su Yee, Min Yong Jeon, Yudong Jang, and Kyung Hyun Park, "Monolithic dual-mode distributed feedback semiconductor laser for tunable continuous wave terahertz generation" Optics Express, vol. 17, No. 16, Aug. 3, 2009.

Sushil Kumar, "Recent Progress in Terahertz Quantum Cascade Lasers", IEEE Journal of Selected Topics in Quantum Electronics, vol. 17, No. 1, Jan. / Feb. 2011.

M. Fischer, G. Scalari,Ch,.Walther,J.Faist, "Terahertz quantum cascade lasers based on In0.53Ga0.47Al0.48As/InP", Journal of Crystal Growth 311 (2009) 1939-1943.

H. Ahmad, A. A. Latif, M. Z. Zulki°, N. A. Awang, and S. W. Harun, "High power dual-wavelength tunable fiber laser in linear and ring cavity configurations", Chinese Optics Letters, Jan. 10, 2012.

Anselm J. Deninger & A. Roggenbuck & S. Schindler & S. Preu, "2.75 THz tuning with a triple-DFB laser system at 1550 nm and InGaAs photomixers" Infrared Milli Terahz Waves, 36:269-277, (2015).

Mohammad Reza K. Soltanian, Iraj Sadegh Amiri, S. Ehsan Alavi, and Harith Ahmad, "Dual-Wavelength Erbium-Doped Fiber Laser to Generate Terahertz Radiation Using Photonic Crystal Fiber", Journal of Lightwave Technology, vol. 33, No. 24, Dec. 15, 2015.

Lianlian Dong, Fang Xie, Sen Ma, Yunzhi Wang, and Liang Chen, "Simple tunable dual-wavelength fiber laser and multiple self-mixing interferometry to large step height measurement" Optics Express, vol. 24, No. 19 | Sep. 19, 2016.

Shilong Pan,* Xiaofan Zhao, and Caiyun Lou, "Switchable single-longitudinal-mode dual wavelength erbium-doped fiber ring laser incorporating a semiconductor optical amplifier", Optics Letters / vol. 33, No. 8 / Apr. 15, 2008.

Xuliang Fan, Wei Zhou, Siming Wang, Xuan Liu, Yong Wang, and Deyuan Shen, "Compact dual-wavelength thulium-doped fiber laser employing a double-ring filter" Applied Optics, vol. 55, No. 12 / Apr. 20, 2016.

Michael Y. Frankel and Ronald D. Esman, "Optical Single-Sideband Suppressed-Carrier Modulator for Wide-Band Signal Processing" Journal of Lightwave Technology, vol. 16, No. 5, May 1998.

B. Globich, R. J. B. Dietz, S. Nellen, T. Gobel and M. Schell, "Terahertz detectors from Be-doped low-temperature grown InGaAs/InAlAs: Interplay of annealing and terahertz performance" AIP Advances 6, 125011 (2016).

Yuanxun Ge, Jianjun Cao, Zhenhua Shen, Yuanlin Zheng, Xianfeng Chen and Wenjie Wan, "Terahertz wave generation by plasmonic-enhanced difference-frequency generation", J. Opt. Soc. Am. B, vol. 31, No. 7, Jul. 2014.

J. A. L'huillier, G. Torosyan, M. Theuer, Yu. Avetisyan, R. Beigang, "Generation of THz radiation using bulk, periodically and aperiodically poled lithium niobate." Applied Physics B.

J. A. L'huillier, G. Torosyan, M. Theuer, Yu. Avetisyan, R. Beigang, "Generation of THz radiation using bulk, periodically and aperiodically poled lithium niobate., Part 2: Experiments" Applied Physics B.

Kenneth D. Skeldon, Lindsay M. Reid, Viviene McInally, Brendan Dougan, and Craig, "Physics of the Theremin", vol. 66, No. 11, Nov. 1998, pp. 945-955, Nov. 1998.

* cited by examiner (a) Linear (b) Ring

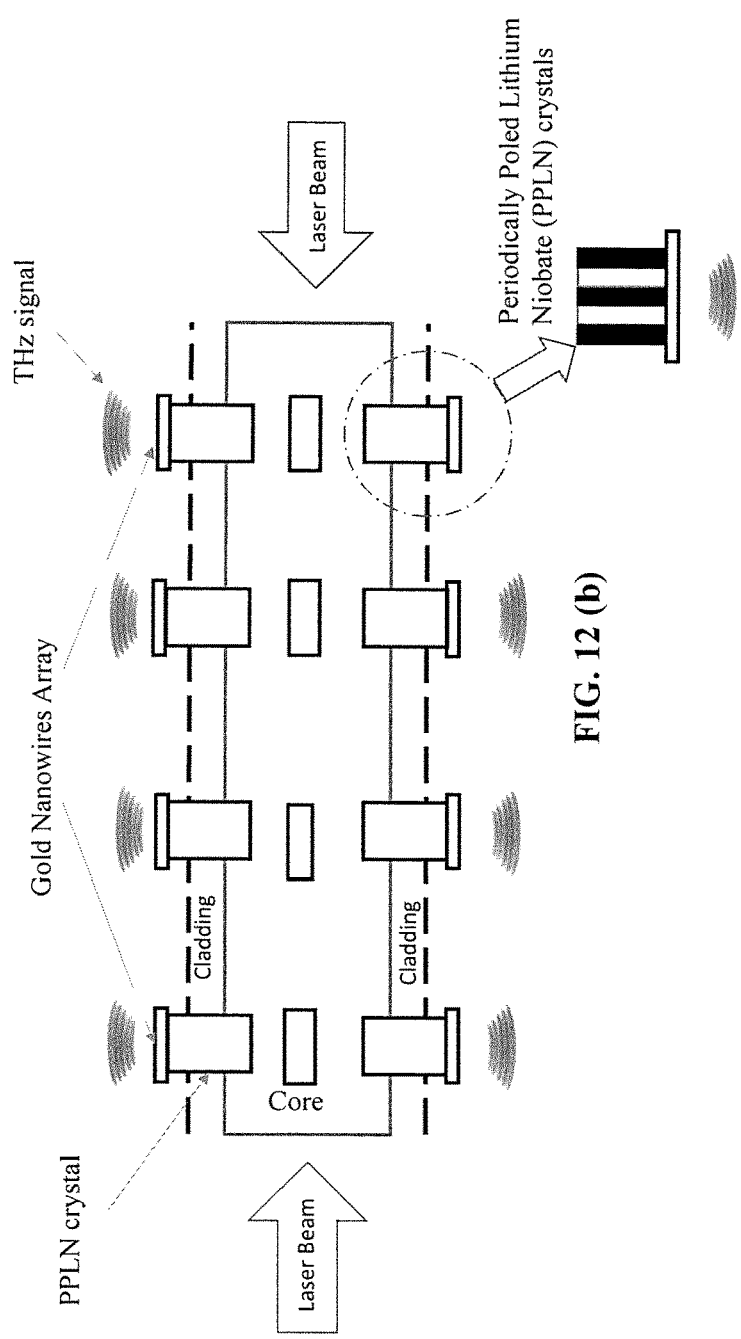
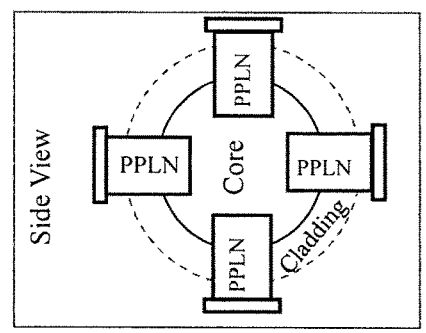
FIG. 12 (b)
FIG. 12 (a)

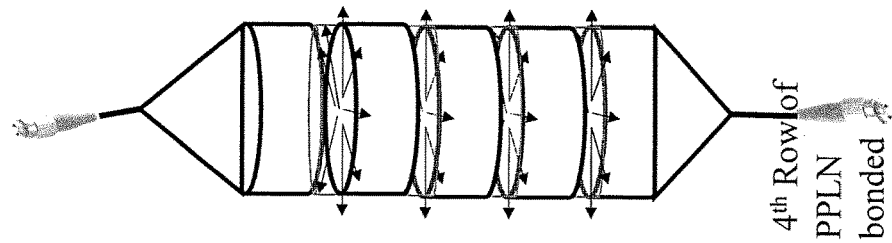
FIG. 13(d)
4th Row of PPLN bonded
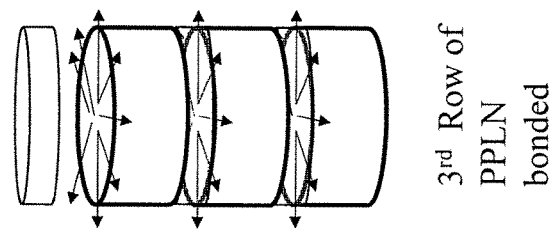
FIG. 13(c)
3rd Row of PPLN bonded
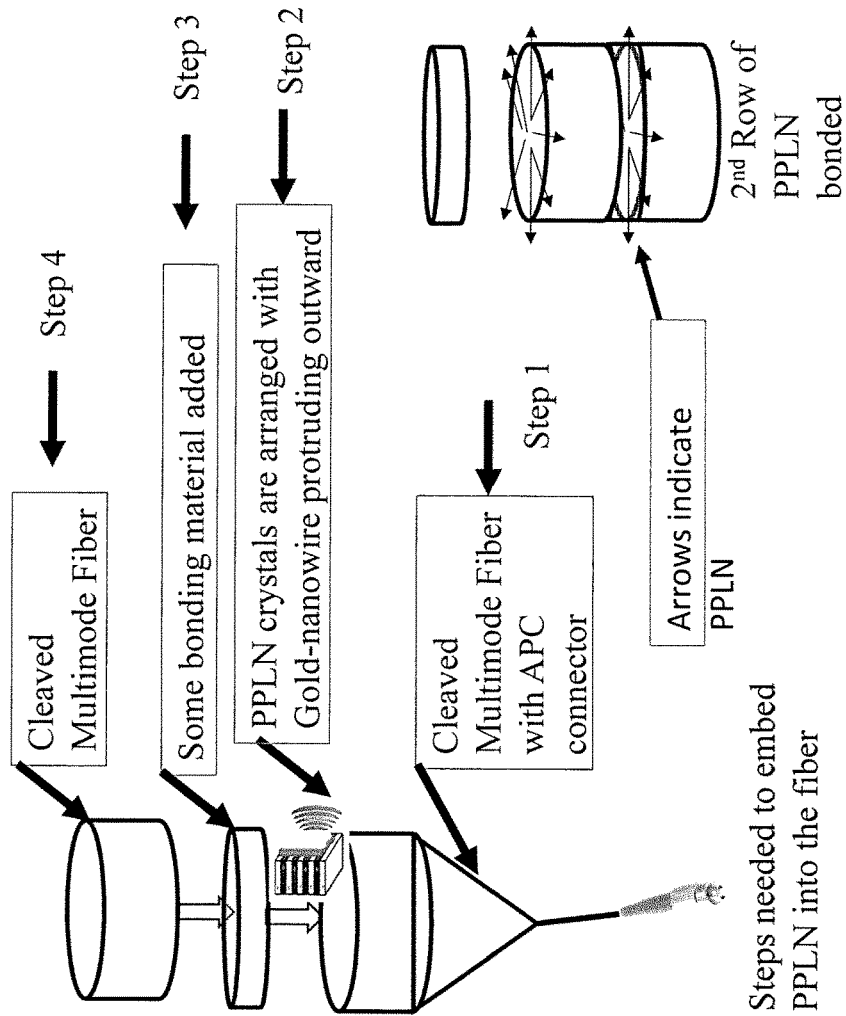
FIG. 13(b)
2nd Row of PPLN bonded
FIG. 13(a)
Steps needed to embed PPLN into the fiber

FIBER-BASED CONTINUOUS OPTICAL BEAT LASER SOURCE TO GENERATE TERAHERTZ WAVES USING LITHIUM NIOBATE CRYSTAL EMBEDDED IN THE FIBER

BACKGROUND OF THE INVENTION

1. Field of the Invention

The invention generally relates to electro-magnetic wave generation and, more specifically, to a fiber-based continuous optical beat laser source to generate terahertz ("THz") waves using specially configured lithium niobate crystals embedded in the fiber.

2. Description of the Prior Art

The development of efficient THz systems using a combination of electronic and optical technologies is an ongoing and important research topic. THz waves have potential applications in sensing and imaging because different materials have highly distinguishable spectral fingerprints due to their enhanced molecular and atomic rotational and vibrational resonances in the terahertz frequency band. Because the THz band has low photon energy levels of 0.41 and 41 meV at frequencies of 0.1 THz and 10 THz, respectively, it is not as harmful as X-ray. The current fiber based laser systems for CW (continuous Wavelength) are not user friendly.

Furthermore, compared to X-ray radiation, terahertz waves are more suited for high-resolution sensing and imaging. Due to its non-ionizing nature, it can be exploited in various fields and applications, such as biomedical (Pickwell et al., 2006) [1] and security screenings (Karpowicz et Al., 2005) [2]. They have also greater penetration than visible or near infrared wavelengths and have better spatial resolution than microwaves. Also importantly, biological molecules, including proteins, RNA, and DNA, have rotational and vibrational modes within 0.1-5 THz range. This provides spectroscopic fingerprints for different tissue identification. For instance, THz imaging and spectroscopy have been shown of utility in detecting molecular signatures in gases, distinguishing healthy and cancerous tissues, detecting molecular hydration, or probing DNA hybridization.

Typically, the CW-THz system uses two CW laser sources; one with a fixed wavelength and another with a tunable wavelength. In such systems, CW-THz radiation is emitted when the two laser sources with slightly different wavelengths (i.e., beat signal) combine either in a THz-photo-mixer or a nonlinear optical crystal. The difference wavelength can be tuned over a range of several nanometers that covers a range of frequencies in the terahertz gap (Preu et al., 2011) [3]. Some of the CW laser sources used for driving the THz-photo-mixer are distributed feedback (DFB) laser diodes (Kim et al., 2009) [4], QCLs (Kumar, 2011) [5], and group III-V lasers (Fischer et al., 2009)[6]. Because such systems require at least two laser sources, the experimental setups are relatively costly.

FIGS. 1a-1c show three different known techniques used for generating continuous wave (CW) THz-wave radiation. An array waveguide grating (Ahmad et al., 2012) [7] shown in FIGS. 1a and b have linear and ring configurations with 5 m long EDFA as a gain medium. Both of the configurations use either isolator or circulator. Moreover, AWGs are not continuously tunable (i.e., fixed wavelength channel separation) and their tuning range is limited to around 12 nm range.

Another technique developed by Deninger et al.[8], was to use three different independent laser sources as shown in FIG. 1c, to achieve a wide tuning range of CW-THZ radiation with continuous tuning range. However, this system comprises of three independent laser systems thus making it not only an expensive but also a noisy system.

Some of the other methods used for generating tunable dual-wavelengths at telecom optical wavelengths in a single laser source is achieved by using a photonic crystal fiber (Soltanian et al., 2015) [9], FBG filters (Dong et al., 2016) [10], a Fabry-Perot filter in conjunction with an optical band-pass filter (Pan et al., 2008) [11], a fiber double-ring filter (Fan et al., 2016)[12]

Although the approach of combining two independent CW laser sources has facilitated significant advancements of CW-terahertz systems, they still suffer from the negative effects of noise mixing from both CW laser sources and frequency instability which affects the beat frequency signal generated by the photo-mixing of two slightly different wavelengths. One of the noise reduction techniques is to employ external modulators (Frankel et al., 1998) [13] that mitigate the uncorrelated noises from mixing two independent CW lasers.

They are bulky, inefficient, and very expensive. The existing technology uses a long erbium doped fiber amplifier (EDFA) as a gain media. The disadvantages of this system include the following:
a) Requires extra optical pump (laser);
b) Limited output power;
c) Requires very expensive optical components such as isolators and circulators which in turn drives the price of the laser source higher;
d) Uses a very complicated way of wavelength selection; and
e) At least two separate laser systems are needed for generating THz radiation.

SUMMARY OF THE INVENTION

The source according to the invention is able to eliminate all the drawbacks that exist with the current systems. The proposed laser system uses bidirectional semiconductor optical amplifier (SOA) for amplification and introduces a unique feature of adjustable dual/single output ports as shown in FIG. 4. This feature gives the user an option to use the system either as a single source or as a dual source. It is just like saying buy one and get one free. To the best of our knowledge, this feature is unique and never has been implemented in any existing system.

Another novel feature of the system is that we can control the output power very easily.

There are two ways one can control the output power by simply
a) adjusting current setting of the SOA (s) or
b) Adjusting polarization controller (PC).

The proposed design uses minimum number of components and hence we are able to lower the cost significantly. It is based on a TF (tunable filter), a Fiber Bragg Gratings (FBG) and SOA technologies that can be designed to operate at different optical bands. This novel system does not require any cooling system. In addition, since there are no isolators, circulators, or long fiber lengths in the module and due to the simplicity of the cavity, the proposed fiber laser has the potential to be implemented in photonic integrated circuit (PIC) platform, leading to compact modules.

One of the most important characteristics of the invention is that it requires only one source as oppose to multiple sources to generate THz radiation. Thus, the invention demonstrates an efficient beam combining scheme based on merging two bidirectional fiber ring cavities to create a simple, compact and inexpensive fiber ring laser structure that is capable of generating dual-wavelengths. In this work, we demonstrate a novel technique of dual-wavelength selection with continuous tunability over the C-band of 20.42 nm at room temperature, which generates widely tunable CW-THz radiation via photo-mixing. Furthermore, we explore the coherent beam combining method based on the passive phase-locking mechanism of two C-band low power SOAs-based all-single-mode fiber hybrid compound-ring resonator by exploiting beam combining (i.e., interference) at 3 dB fiber couplers that connect two parallel nested ring cavities. As opposed to using multiple laser sources (i.e., three CW laser sources) we achieve a wide tuning range of CW-THz radiation by using single laser source. The proposed dual-wavelength fiber laser source is used as a single source to excite a CW-THz photo-mixer where CW-THz radiation is generated and detected using a CW-THz photo-mixer and pyroelectric based THz sensor. We had successfully generated THz radiation from 0.8 and 2.51 THz at room temperature. However, the system with the off-the-shelf photo-mixer, is expensive, bulky and generated only a few nano watts of THz radiation. The THz generation using nonlinear optics can be a promising approach because of its simplicity, wide tunability, and capability of generating high-power THz radiation. Hence, the current laser system can be modified into an inexpensive, all fiber-based THz generator by using Lithium Niobate (LN) crystals with gold nanowire array embedded in a fiber.

The bidirectional operation with variable external Sagnac loop mirrors and the use of semiconductor optical amplifiers as well as passive phase-locking scheme eliminates the use of high power components, such as optical isolators, circulators and power combiners that usually set limits on the output power that the fiber ring laser can deliver. Furthermore, the proposed structure becomes on-chip scalable scheme due to the fact that the aforementioned optical components are eliminated in the laser cavity.

BRIEF DESCRIPTION OF THE FIGURES

The above and other aspects, features and advantages of the present invention will be more apparent from the following description when taken in conjunction with the accompanying drawings, in which:

FIG. 8a depicts the improved THz generator nano-structure with Ti-diffused LN waveguide;

FIG. 9b is a schematic diagram of the setup shown in FIG. 9a;

FIG. 12a is a cross section of an MMF with four embedded crystals;

FIG. 12b illustrates a filament of an array of PPLN crystals with gold nanowires facing outwardly;

FIGS. 13a-13d illustrate the methodology for fabricating a fiber filament; and

DETAILED DESCRIPTION

Figure 4:
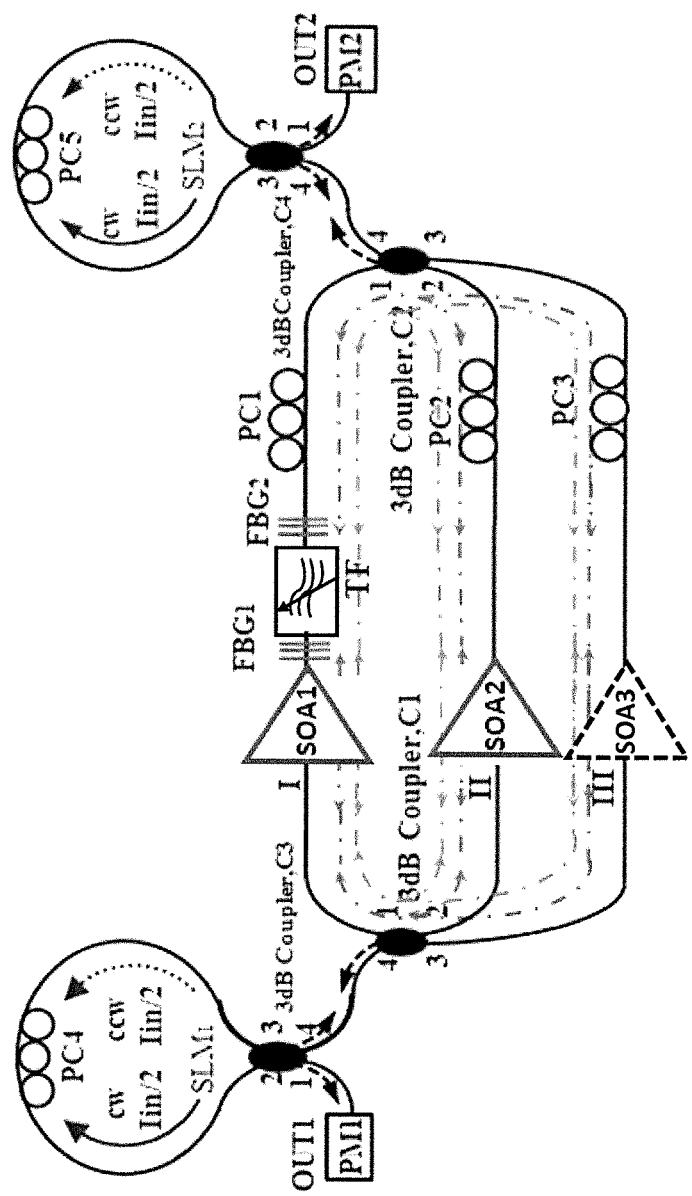
FIG. 4 diagrammatically illustrates an experimental setup of the dual Sagnac loop mirror dual-wavelength SOA-based tunable fiber hybrid compound-ring laser.
Figure 5A:
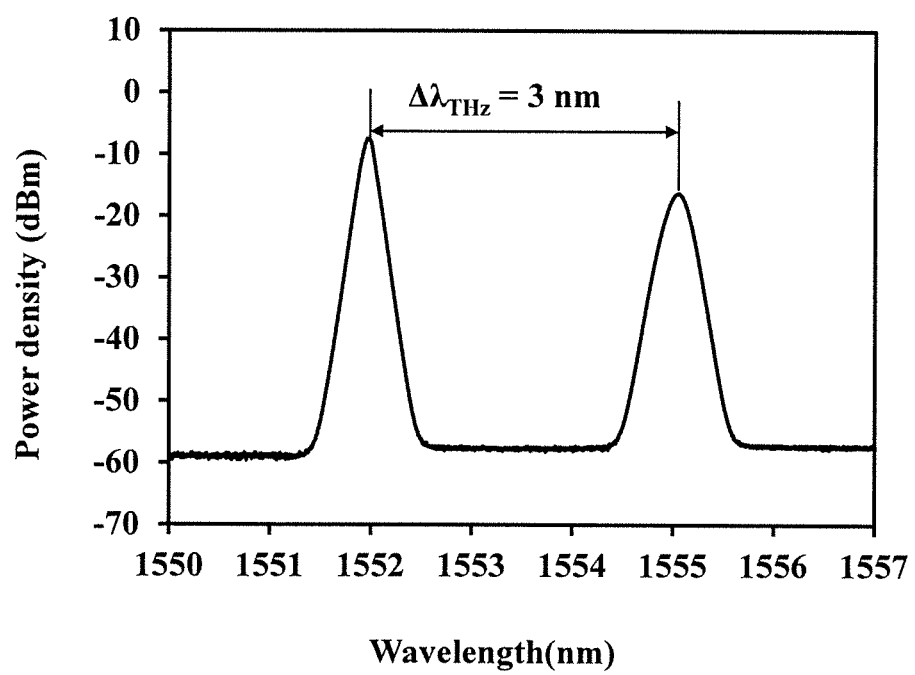
FIGS. 5a and 5b illustrate the wavelength spectrum of the dual-wavelength fiber hybrid compound-ring laser, showing wavelength separation between the fixed and tunable wavelength of 3 nm and 20.35 nm, respectively.
Figure 5B:
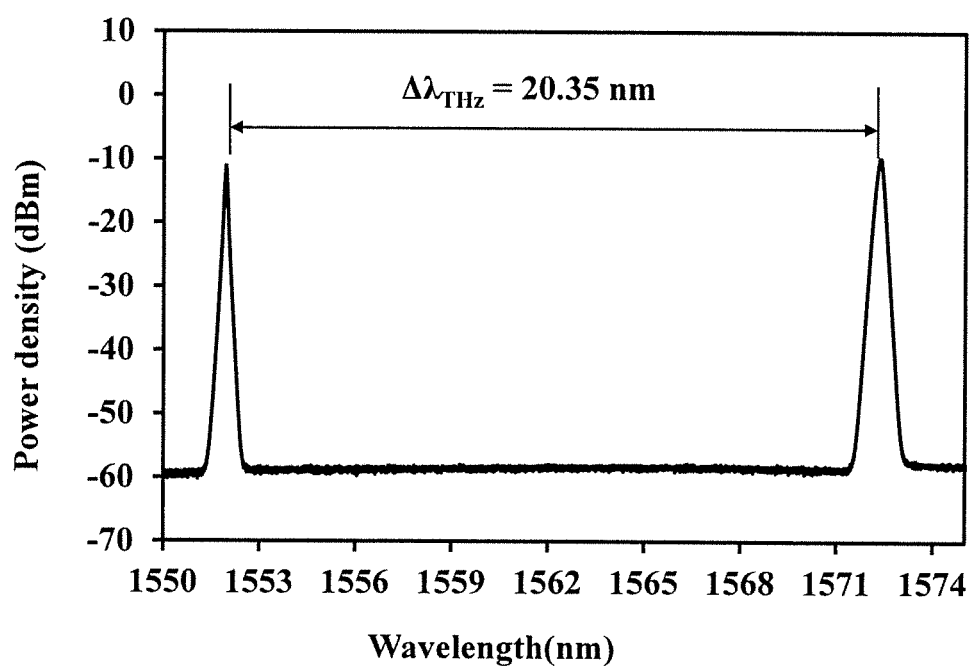

Referring now to the Figures, and first referring to FIG. 4, an experimental setup is illustrated of the C-band SOA-based tunable fiber laser with two nested ring cavities (i.e., hybrid compound-ring resonator) and two broadband SLMs that can serve as either dual-output ports or a single output port depending on the reflectivity of each SLM. Each ring cavity is comprised of two branches: I-II and I-III, for the inner and the outer ring cavity, respectively. Both ring cavities share a common branch, I, which contains $SOA_1$ (Kamelian, OPA-20-N-C-SU), a tunable optical filter (TF-11-11-1520/1570) sandwiched between two similar FBGs, and a polarization controller, $PC_1$. Branch II contains $SOA_2$ (Thorlabs, S1013S), and a polarization controller, PC2. Due to the lack of availability of a third SOA, branch III only contains a polarization controller, $PC_3$. As FIG. 4 portrays, all branches are connected by two 3 dB fiber couplers, $C_1$ and $C_2$, which are connected to $SLM_1$ and $SLM_2$, correspondingly. Each SLM, $SLM_1$ and $SLM_2$, in conjunction with a PC ($PC_4$ and $PC_5$, respectively) act as a variable optical reflector. By adjusting $PC_4$ or $PC_5$, one can manipulate the reflectivity of $SLM_1$ and $SLM_2$, respectively, and switch between single and dual-output port configurations. Sandwiching the low power tunable optical filter (TF) in the common branch, I, between two similar FGBs that are centered around 1551.98 nm, allows dual-wavelength selection, with one fixed at the 1551.98 nm, and continuous wavelength tuning up to 1572.42 in. The three PCs ($PC_1$, $PC_2$, and $PC_3$) control the state of polarization of the light circulating within the compound ring cavity 1) Principle of Operation Generation of a continuously tunable dual wavelength (i.e., two colors) was achieved in a hybrid compound-ring resonator using two fiber Bragg grating filters, $FBG_1$ and $FBG_2$, of the same Bragg wavelength (i.e., $\lambda_{FBG1}=\lambda_{FBG2}$) and a widely tunable optical filter, TF, of transmittance spectra. The fixed wavelength is selected by the FBGs, and the tunable wavelength, $\lambda_{TF}$, is selected by the TF. The wavelength selection is performed in the common branch, I, of the hybrid compound-ring cavity.

The principle of operation of the proposed fiber laser can be described as follows: assume that both of the semiconductor optical amplifiers (SOAs) are driven above the threshold bias current level, and the reflectivity of each output coupler formed by a Sagnac loop mirror (i.e., $SLM_1$ and $SLM_2$) is adjusted to ≤0.1%. When the pump level (i.e., bias current level) of either SOA is more than the total fiber compound-ring cavity losses, amplified spontaneous emission (ASE) emitted from the SOAs propagates in the forward and backward directions. For instance, when a bias current $I_B$ of approximately 75 mA is injected into $SOA_1$ (branch I), the emitted ASE emitted by $SOA_1$ circulates in a clockwise (cw) direction. The clockwise propagating ASE reaches the $FBG_1$ filter, which reflects a fixed wavelength, $\lambda_{FBG1}$, back into $SOA_1$ while the remaining ASE signal propagates through the tunable filter, TF, which selects a tunable wavelength $\lambda_{TF}$ and rejects the rest of the ASE spectrum. The selected tunable wavelength, $\lambda_{TF}$, is different from the Bragg wavelength of the FBGs. Thus, the selected beam with tunable wavelength, $\lambda_{TF}$, passes through the $FBG_2$ filter and the polarization controller, $PC_1$, before it reaches port 1 of the 3 dB fiber coupler, $C_2$, where it is equally split (i.e., 50% goes to port 2 and port 3, respectively) and is coupled into branch II and branch III of the fiber compound-ring cavity. Half of the selected beam that propagates into branch II passes through a polarization controller $PC_2$. It is amplified by $SOA_2$ (i.e., when its bias current level is above 180 mA) before it arrives at port 2 of the 3 dB fiber coupler $C_1$, where the amplified signal is also equally split between port 1 and 4 after being combined with the beam at port 3 that propagates through Branch III. Fifty percent of the selected beam at port 4 of the 3 dB fiber coupler $C_1$ is fed into the output coupler, $SLM_1$. As the reflectivity of $SLM_1$ is set at ≤0.1%, the selected beam with $\lambda_{TF}$ exits at port 1 (i.e., OUT1) of the 3 dB fiber coupler, $C_3$. The other 50% of the selected beam coupled into port 1 of the 3 dB fiber coupler $C_1$ is further amplified by $SOA_1$. Therefore, this closes the ring structure, completes a round trip in the clockwise direction and allows lasing to occur at tunable wavelength $\lambda_{TF}$.

As mentioned earlier, the wavelength, $\lambda_{FBG1}$, selected by the $FBG_1$ is reflected back and propagates in the counter-clockwise direction through $SOA_1$, where it is amplified and is equally split by the 3 dB fiber coupler $C_3$ and is coupled (i.e., 50% each) into branch II and branch III of the fiber compound-ring cavity. Fifty percent of the selected beam with fixed wavelength, $\lambda_{FBG1}$, which propagates in branch II is further amplified by the $SOA_2$, while the other 50% that propagates through branch III. Both light beams propagate through polarization controllers, $PC_2$, and $PC_3$, respectively, before being combined and equally split at port 1 and 4 of the 3 dB fiber coupler $C_2$. Fifty percent of the selected beam at port 4 of the 3 dB fiber coupler $C_2$ is fed into the other output coupler, $SLM_2$, and exits at port 1 (i.e., OUT2) of the 3 dB fiber coupler, $C_4$. The other 50% of the beam with the selected wavelength, $\lambda_{FBG1}$, that is coupled into branch I reaches the other fiber Bragg grating filter, $FBG_2$, and reflects back toward the 3 dB fiber coupler, $C_4$. There, it is equally split and is coupled into branch II and branch III for further amplification, which also leads to lasing of the fixed Bragg wavelength, $\lambda_{FBG}$, after it traces its round trip back to the $FBG_1$ filter while going through further amplification by $SOA_1$ and $SOA_2$.

Note that as there is no optical isolator, the same wavelength selection of $\lambda_{TF}$ and $\lambda_{FBG1}$ occurs from the counter-clockwise propagating ASE, where the selected wavelengths $\lambda_{TF}$ and $\lambda_{FBG1}$ circulate in the counter-clockwise and clockwise directions and exit at the output couplers, $SLM_2$ and $SLM_1$, respectively. Thus, two lasing wavelengths (i.e., tunable $\lambda_{TF}$ and fixed $\lambda_{FBG}$) coexist in the fiber hybrid compound-ring cavity, and they are extracted at both output couplers, OUT1 and OUT2. If the reflectivity of output coupler $SLM_1$ is set to maximum (i.e., ≥99.9%), then the light beam of dual wavelength exits from the output coupler $SLM_2$, or vice versa. The wavelength separation (i.e., $\Delta\lambda_{THz}$) is controlled by continuously adjusting the tunable filter, TF. An optical spectrum analyzer (OSA), variable optical attenuator (VOA) and optical power meter (PM) were used to characterize the proposed fiber hybrid compound-ring laser. Note that the path lengths of both loops are almost the same since all branches have identical length and all fiber connections are done by using FC/APC connectors.

2) Dual-Wavelength Tunability and Power Stability

Figure 1A:
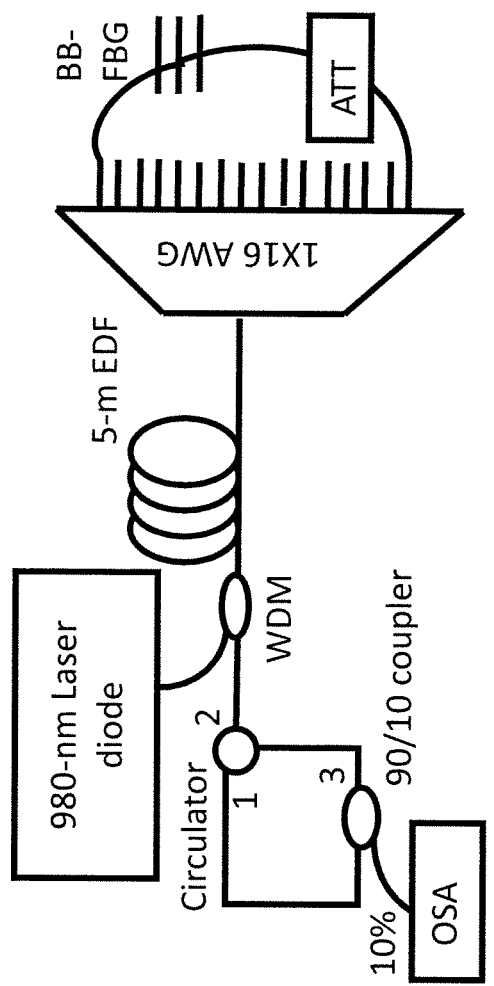
FIGS. 1a-1c show different existing methods for generating Dual-wavelength for continuous wave (CW) THz-wave generation a) Linear cavity with 1×16 AWG and circulator b) Ring cavity
Figure 1B:
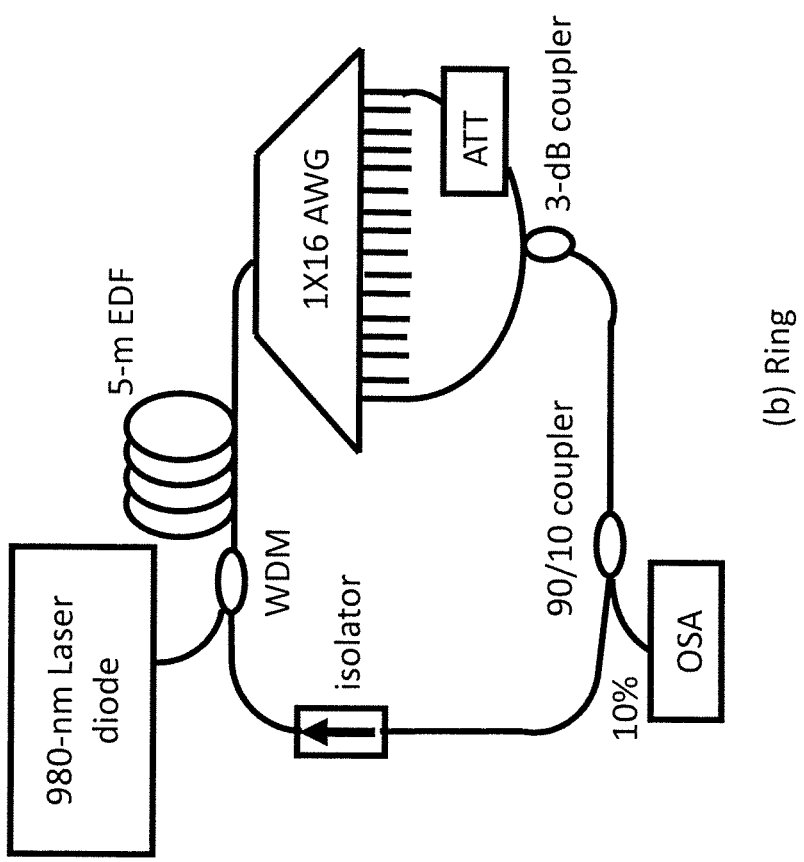
Figure 1C:
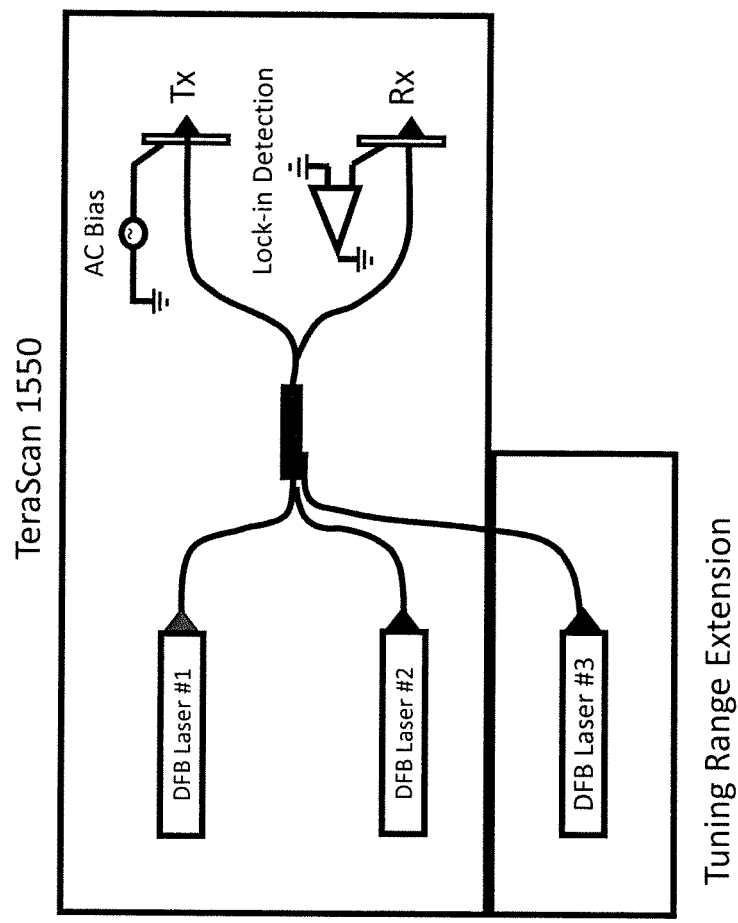
Figure 2B:
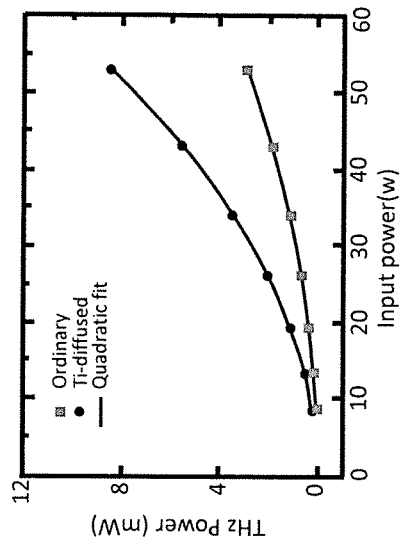
FIG. 2b illustrates the output characteristic of the Ti-diffused configuration shown in FIG. 2a and compared with the non-diffused setup. Both the outputs are quadratic fitted. The parameter of the nanostructure are 50 nm for R and 400 nm for D.
Figure 2A:
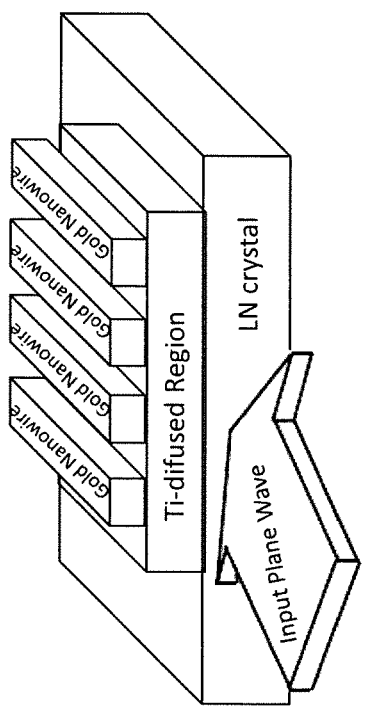
FIG. 2a depicts a known THz generator nano-structure with Ti-diffused LN waveguide.

We first set the bias current for both SOAs at 200 and 500 mA, for $SOA_1$ and $SOA_2$, respectively. The reflectivity of the $SLM_1$ and $SLM_2$ were set and kept constant at ≤0.1% and ≥99.9%, respectively. Then, the dual-wavelength signal of the output light beam was measured with an OSA. The wavelength separation (i.e., wavelength beat signal) was tuned by manually adjusting the tunable filter, from 1554.98 to 1572.33 nm while optimizing the polarization controllers, $PC_1$, $PC_2$, and $PC_3$, at each wavelength. Moreover, the fixed wavelength was selected by two FBG filters, which are centred at 1551.98 nm. FIG. 2(a) shows wavelength separation (i.e., beat signal: $\Delta\lambda_{TH}=\lambda_2-\lambda_1$) of 3 nm, and FIG. 2(b) shows a wavelength separation of 20.35 nm, which corresponds to CW-THz beat frequency (i.e., $\Delta\upsilon_{THz}=c*(\Delta\lambda_{THz}/(\lambda_1*\lambda_2))$) of 0.37 and 2.5 THz, respectively.

Figure 6:
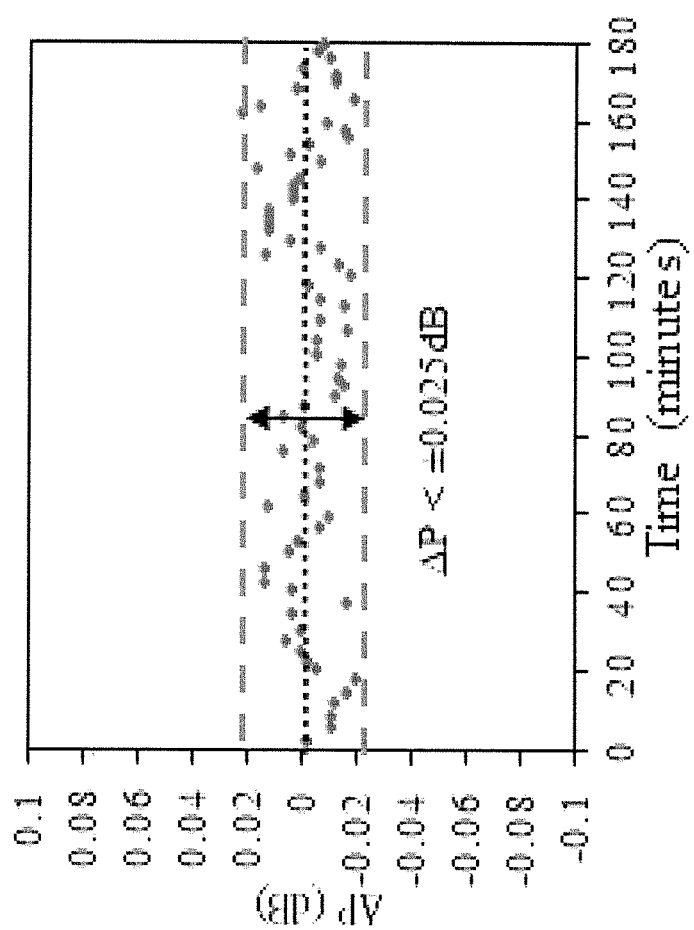
FIG. 6 shows the output power short-term fluctuations measured over three hours at room temperature.

The peak signals deducted from the measured output wavelength spectra by using an OSA (e.g., See FIGS. 2a, 2b) were used to determine the optical signal-to-noise ratio (OSNR). We subtracted the peak power value at each centre wavelength from the background noise level of each wavelength spectrum. The OSNR for the fixed wavelength and tunable wavelength remained well above +50 dB and +45 dB over the whole wavelength tuning range, respectively. We performed a short-term optical power stability test at room temperature with SOA1, and SOA2 set at the standard bias current levels of 200 and 500 mA, respectively. The optical power stability test was carried out over a total duration of 180 minutes with three-minute intervals and an OSA resolution bandwidth of 0.01 nm. FIG. 6 demonstrates that the proposed fiber hybrid compound-ring laser whose power fluctuations were within ±0.025 dB and could have been further reduced by the proper packaging of the system to make it more stable.

3) Single and Dual Output Port Operation Characterization

The experimental tunable fiber laser can operate with two adjustable and switchable output ports, $OUT_1$ and $OUT_2$.

The output power can be adjusted from either port, as mentioned earlier, by manipulating the reflectivity of $SLM_1$ and $SLM_2$ but maintaining constant bias levels for $SOA_1$ and $SOA_2$. In single port operation, only one SLM is set to maximum reflectivity and the other is set to minimum reflectivity.

Figure 7:
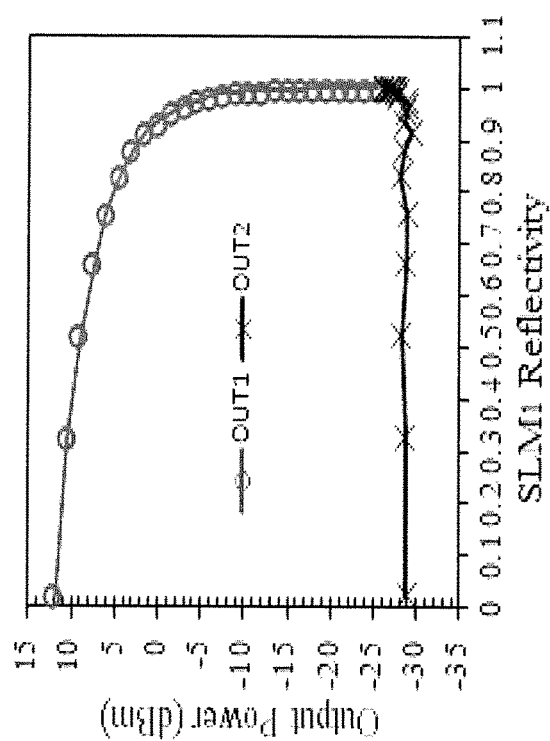
FIG. 7 illustrates the output power from both output ports, OUT1 (filled circles) and OUT2 (filled squares) for different reflectivity values of the Sagnac loop mirror, $SLM_1$ for dual-output port operation while maintaining constant output power at OUT2 constant at +8.95 dBm.

In order to characterize the power tunability of both ports, $SLM_1$ was set to minimum reflectivity while $SLM_2$ was set to maximize reflectivity. The initial output power measured from $OUT_1$ and $OUT_2$ was +11.85 dBm and −28.9 dBm respectively. By maintaining the reflectivity of $SLM_2$ to maximum and sweeping $SLM_1$ reflectivity from minimum to maximum by adjusting $PC_4$, we obtained the characterization in FIG. 7. As evident, the output power from $OUT_1$ swept from +11.85 dBm to −28.5 dBm as the $SLM_1$ reflectivity was changed. This demonstrates the single output port operation. It should be noted that reversing the initial reflectivity settings for both SLMs is also possible for single output port operation.

Figure 8:
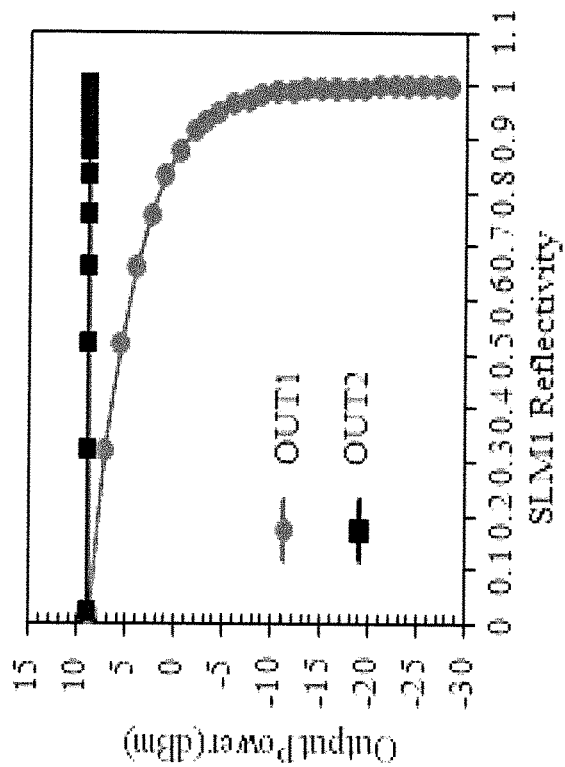
FIG. 8 illustrates the output power from both output ports, OUT1 (filled circles) and OUT2 (filled squares) for different reflectivity values of the Sagnac loop mirror, SLM1 for dual-output port operation while maintaining constant output power at OUT2 constant at +8.95 dBm via $SLM_2$.

Regarding the characterization of dual port operation, both ports were set to minimum reflectivity at first which corresponded to +8.94 dBm and +8.95 dBm for $SLM_1$ and $SLM_2$ respectively. By gradually increasing the reflectivity of SLM1, and thus the power from OUT1 from +8.94 dBm to −28.9 dBm, while adjusting the $SLM_2$ reflectivity simultaneously to keep the $OUT_2$ optical power at +8.95 dBm, the curves in FIG. 8 were obtained. SLM2 reflectivity was adjusted to about 50% to keep its output power from OUT2 fixed at +8.95 dBm while SLM1 was being adjusted from 0.1% to 99% reflectivity.

1. Generation and Detection of CW-THz Radiation

Figure 9A:
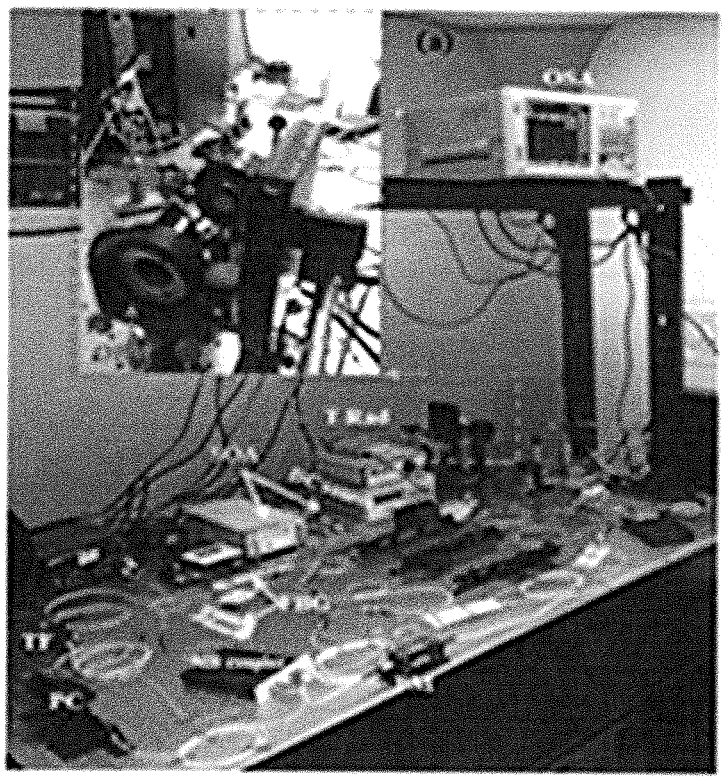
FIG. 9a is a pictorial view of the experimental setup for CW-terahertz radiation measurements (TX: InGaAs-photo-mixer and RX: pyroelectric THz sensor)
Figure 9B:
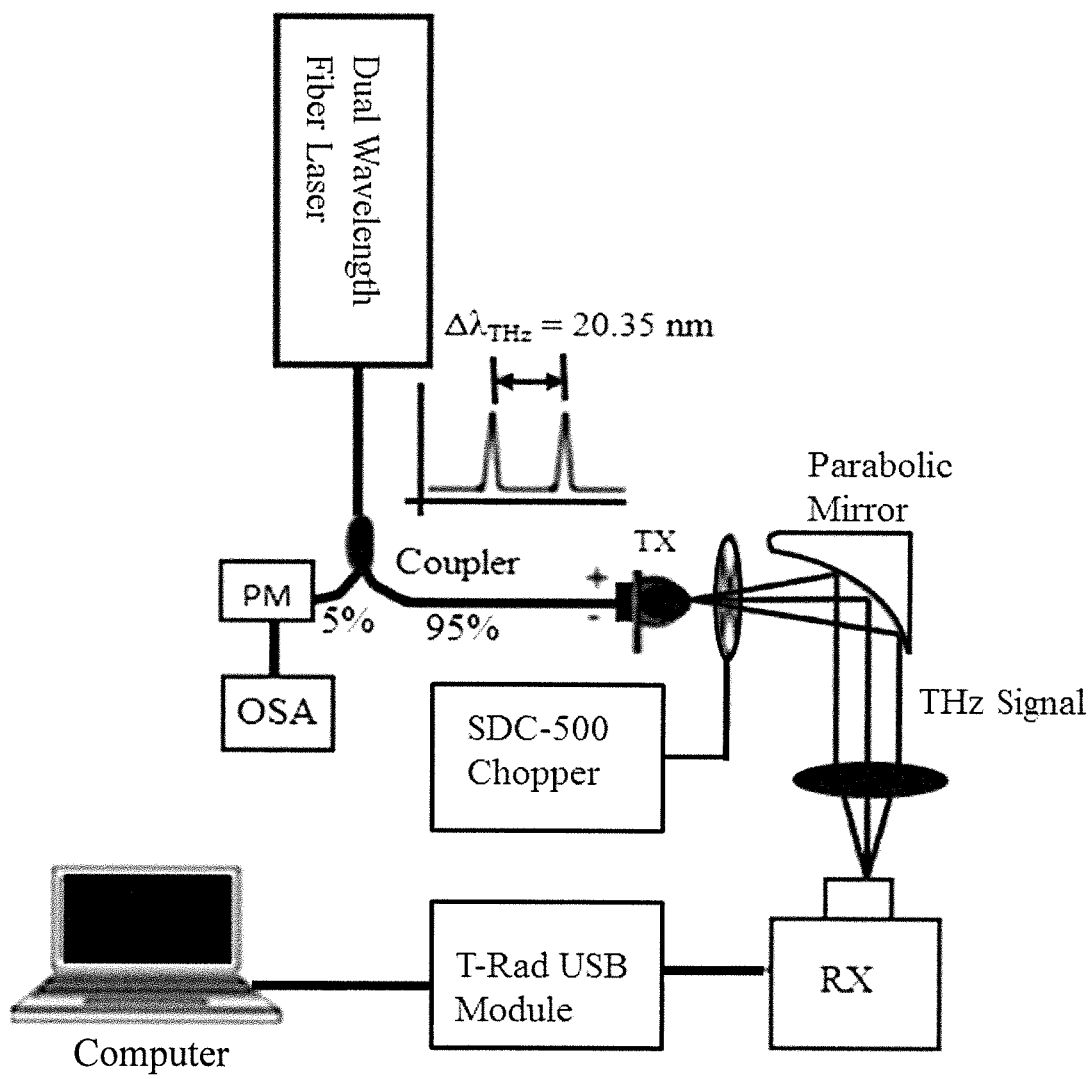

The proposed tunable fiber laser was used as a light source to excite an off-the-shelf photo-mixer (CW-TH based Indium Gallium Arsenide (InGaAs)) as an emitter and a pyroelectric-based terahertz sensor as a detector. The experimental setup and its schematic diagram, used for generating and detecting CW-terahertz radiation, are shown in FIGS. 9*a* and 9*b*. The bias current of $SOA_1$ and $SOA_2$ was kept constant at 250 and 500 mA, respectively. The output power of the laser source was controlled by adjusting the polarization controller, $PC_5$, which was placed in $SLM_2$. We adjusted the PC so that the output power does not exceed 10 mW. A wideband 1×2 single-mode fiber optic coupler with split ratio of 95% and 5% was connected to the output coupler, OUT1, of the laser system. The 95% output port was connected to the CW-THz InGaAs emitter (TX). The 5% output port was connected to an inline power meter, PM, which was used to monitor the excitation power. An optical spectrum analyzer, OSA, was employed to monitor the output spectrum of the dual-wavelength laser. The tunable filter was adjusted manually in steps of 0.1 nm. Note that an automated continuously tunable filter can be used to achieve even higher resolution of wavelength tuning steps. The optical beat signal from the laser source was delivered on the terahertz InGaAs-photo-mixer through a single-mode fiber and FC/APC.

Most of the terahertz radiation generated by the antenna was radiated through the Indium Phosphide (InP) substrate. Thus, a silicon lens was used to couple the radiation into free space. An off-axis parabolic mirror, OPM, was used to collect and collimate the CW-terahertz signal from the THz emitter. A polytetrafluoroethylene (i.e., Teflon) lens was used to focus the CW-terahertz signal onto the pyroelectric-based terahertz detector, which was calibrated from 0.8 to 30 THz (Gentec-EO, Inc). An optical chopper system, which provided a reference signal of 25.7 Hz chopping frequency to the detector module, was employed to increase the signal-to-noise ratio.

A DC voltage source was used to bias the terahertz InGaAs-photo-mixer at −1.4 V to increase the terahertz radiation emitted by the photo-mixer. The utilized CW-THz photo-mixer has carrier lifetime of around 0.3 ps and a bandwidth of around 3 THz (Globisch et al., 2016) [14]. The theoretical bandwidth curve was obtained by using Eq.1 Carpintero et al., 2015), A DC voltage source was used to bias the terahertz InGaAs-photo-mixer at −1.4 V to increase the terahertz radiation emitted by the photo-mixer. The utilized CW-THz photo-mixer has carrier lifetime of around 0.3 ps and a bandwidth of around 3 THz (Globisch et al., 2016)[14]. The theoretical bandwidth curve was obtained by using Eq. 1. Carpintero et al., 2015), $$P_{THz}(\omega) \approx \frac{A}{1 + (\omega\tau)^2} \quad (1)$$

where A is a constant and τ is the photo-carrier lifetime of photo-induced free-charges.

The CW-terahertz generation ranges from 0.875 to 2.51 THz when the tunable filter is tuned from 1554.98 to 1572.33 nm with the filter step size of 0.1 nm. This corresponds to around 1.2 GHz in C-band.

Figure 10:
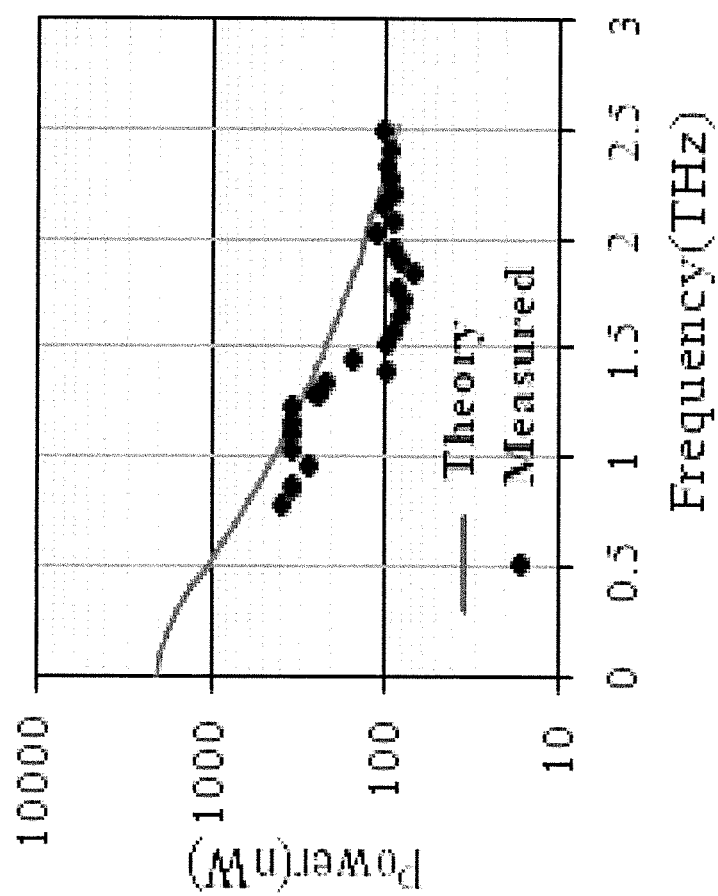
FIG. 10 illustrates the frequency spectrum of CW-terahertz radiation measured by a pyroelectric terahertz detector and theoretical curve fit with A=2 µW and τ=0.3 ps.

The maximum measured average power was around 350 nW around 1 THz as shown in FIG. 10. The measured power dropped around 80 nW above 1.5 THz, which is in agreement with specifications of the utilized CW-terahertz photo-mixer (TOPTICA Photonics, Inc).

Figure 3:
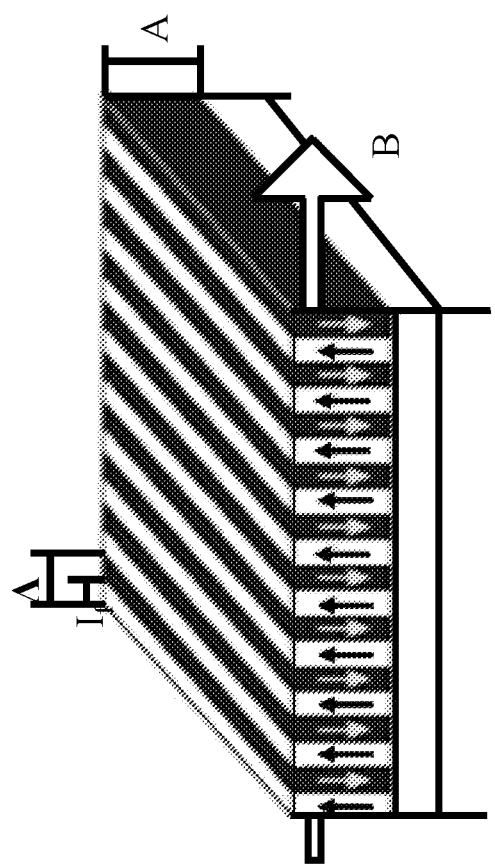
FIG. 3 shows a prior art ppLN surface emitting crystal geometry.

2. Generation and Detection of CW-THz Radiation Via Periodically Poled Lithium Niobate Crystal with Gold Nanowire Array We have demonstrated that the SOA-based fiber laser can be used to generate THz by an off-the-shelf photo-mixer (CW-TH based Indium Gallium Arsenide (InGaAs)) as an emitter. However, the system is expensive, bulky and generated only a few nano watts of THz radiation. The THz generation using nonlinear optics can be a promising approach because of its simplicity, wide tunability, and capability of generating high-power THz radiation. Hence, my current laser system can be modified into an inexpensive, all fiber-based THz generator by using Lithium Niobate (LN) crystals with gold nanowire array embedded in a fiber. Ge et al [15] demonstrated terahertz generation methodology based on nonlinear difference-frequency generation (DFG) inside a metal-insulator-metal (MIM) structure. Furthermore, to enhance nonlinearity and waveguide of THz radiation a Ti-diffused layer sandwiched between gold nanowire arrays and LN crystals were fabricated. (FIG. 2*a*) This structure further increased the concentration of light and thereby, improved the output conversion efficiency, as shown in FIG. 2*b*. Some of the advantages are:

- MIM nano structure has high conversion efficiency (0.531%)
- Wide tunability
- A MIM THz waveguide can be an alternative to a prism coupler in the Cherenkov phase-matched DFG
- MIM nano structure helps reduce high absorption in the LN crystal One of the major drawbacks of LN is the high absorption at THz frequencies, especially in a frequency range above 1 THz. Besides the high absorption a second difficulty is caused by the transverse optical phonon mode at 7.6 THz. L'huillier et al [16, 17] theoretically analyze optical rectification of femtoseconds pulses in periodically, aperiodically, and uniformly poled LN crystals in different geometries of the interacting waves—collinear, Chernkov-type, and surface emitting. To overcome the absorption problem the surface emitting geometry of DFG was experimentally demonstrated that the generated THz-wave was emitted perpendicular to the lateral surface of the periodically poled lithium niobate (ppLN) and its absorption was reduced considerably due to the short path length in the crystal as shown in FIG. 3. Periodically poled domains are the crystal regions in which the nonlinear coefficient of the crystal is reversed (ALTERNATING SHADED REGIONS IN THE FIGURE BELOW). IT IS THESE REGIONS WHICH INTERACT WITH THE OPTICAL beam to allow THz emission with proper phase matching. Some of the advantages are:

- PPLN are more efficient at second-harmonic generation than crystals of the same material without periodic structure.
- The structure is designed to achieve quasi-phase-matching (QPM) in the material
- The THz-wave attenuation is minimized, due to the short path length within the ppLN crystal.

3. A Hybrid PPLN and Gold Metal-Insulator-Metal (MIM) THz Generator

Figure 11B:
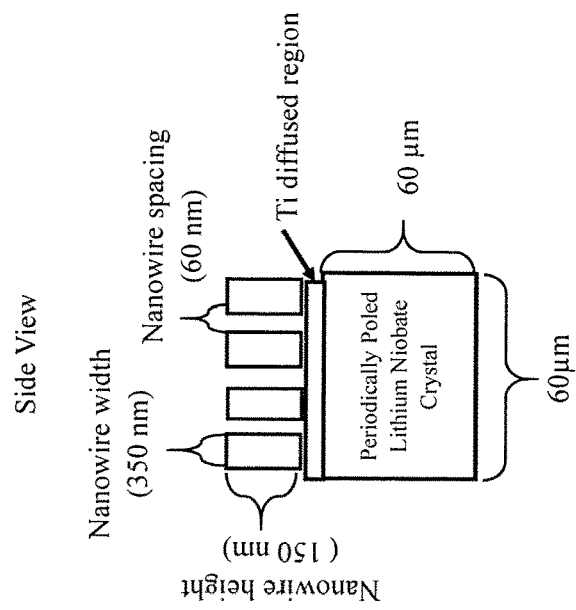
FIG. 11b illustrates a MIM Crystal with optimized dimensions.
Figure 11A:
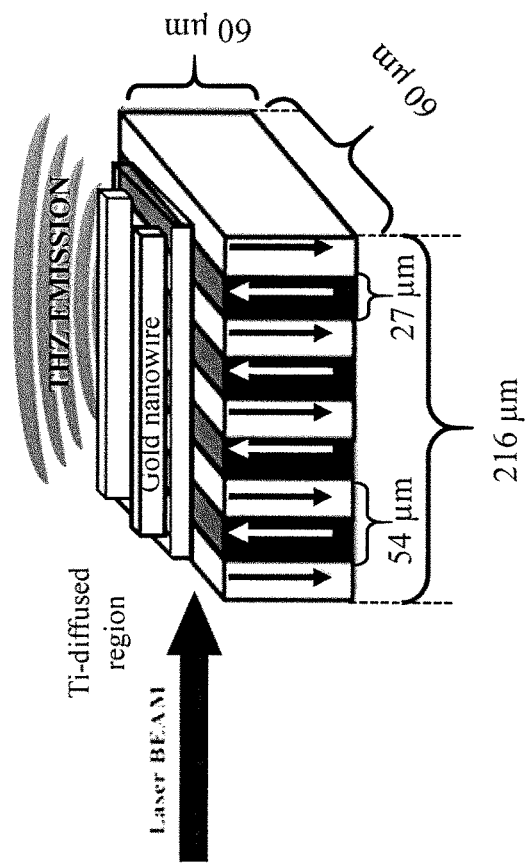
FIG. 11a illustrates a Hybrid PPLN in accordance with the invention.

In order to reduce absorption and improve conversion efficiency, a hybrid source is proposed by combining both PPLN and MIM. First, periodically poled Lithium Niobate (ppLN) crystals are overlaid with golden nanowire arrays and then Ti (Titanium) is diffused in between ppLN and gold nanowire as shown in FIG. 11a. The dimensions of thin gold are: length=20 µm, width=350 nm and height=150 nm and are laid on the top of the upper surface of the crystal with the spacing of 60 nm in between (See FIG. 11b). This ensures optimal coupling and channeling of THz radiation from the crystal into the nanowires.

To maximize THz radiation, multiple crystals will be embedded within the multimode fiber (MMF). Each crystal is embedded about 60 µm inside the MMF with its gold nanowire facing outward. A cross section of such an MMF is shown in FIG. 12a. Please note that only four such crystals are shown. However, depending upon the diameter of MMF fiber, we can embed as many crystals as we can. This configuration of embedded crystals is repeated several times along the length of the fiber as shown in FIG. 12b. Thus, this filament of modified MMF fiber can be spliced into the dual wavelength fiber laser system to generate THz radiation.

Figure 14:
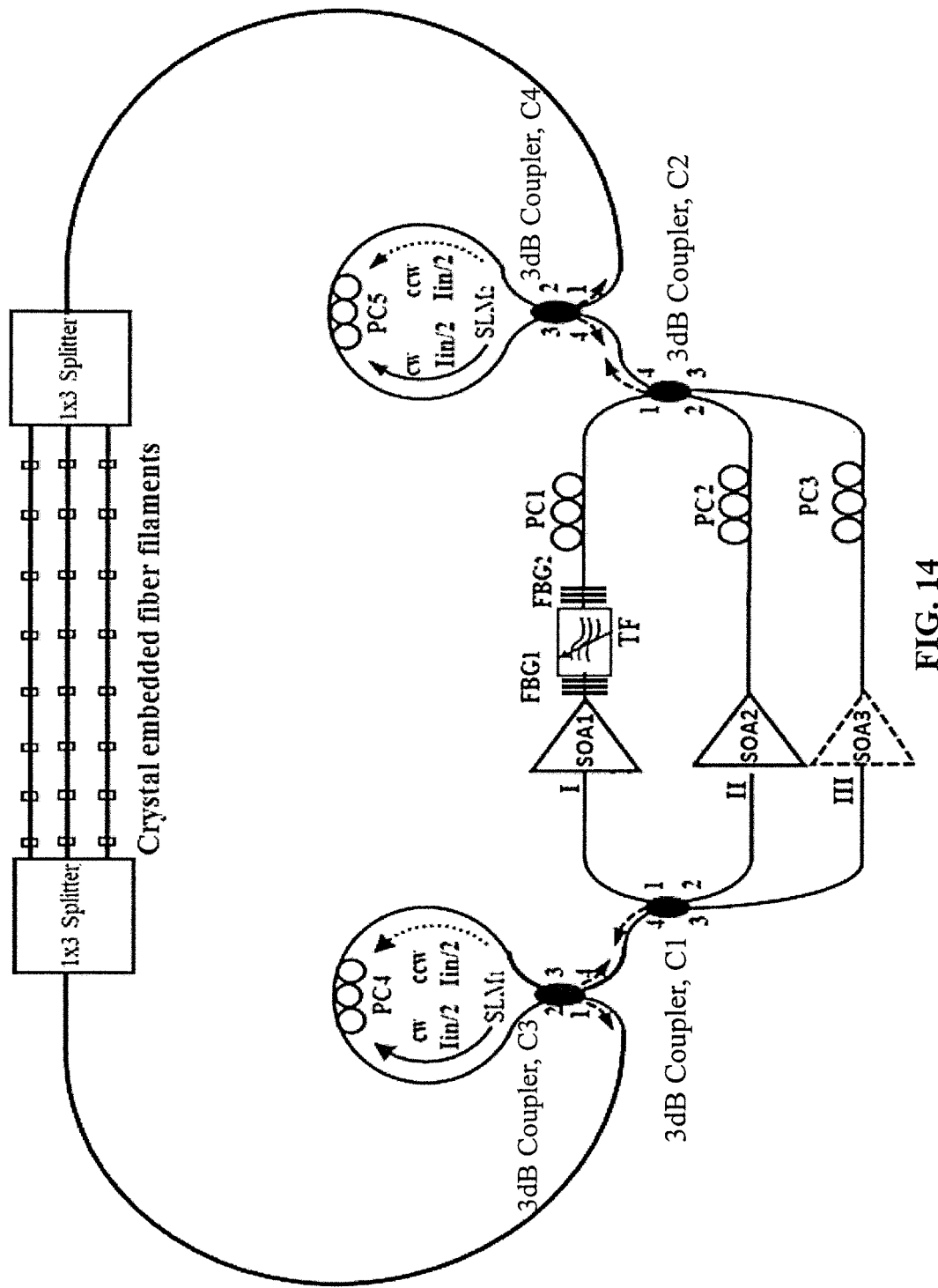
FIG. 14 illustrate an experimental setup of a THz generator via taper fiber PPLN crystal excitation from dual output of the laser.

4. Methodology for Fabricating Fiber Filament of ppLN Embedded in a Multimode a) In order to fabricate fiber filament of PPLN embedded in a multimode fiber the following steps must be taken as shown in FIGS. 13a-d: A multimode fiber with one end connected to APC connector while the other end is cleaved
b) ppLN crystals are placed all around the cross section section of the fiber making sure that the gold nanowires are protruding outward
c) Bonding material added on the top of the crystals
d) Another cleaved multimode fiber is added on top of it
e) This process is repeated several times
f) The filament is completed with an APC connector The MMF fiber filament, housing multiple PPLN crystals, will be incorporated into the fiber laser as shown in FIG. 13b. The two outputs of the fiber laser are connected with a (1×N) splitters. Depending upon the splitter's ratio we can splice/connect the MMF fiber filaments as shown in FIG. 13b. We have used splitters of ratio 1×3 for the demonstration purpose. The unique characteristic of our laser system is that the duel wavelength waves are introduced to the fiber filament from both of the direction in order to excite the PPLN crystals throughout the entire filament as shown in FIG. 14. Hence, the dual output ports of the novel nested ring SOA-based fiber laser with MMF filaments is capable of generating THz radiation with more power.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

REFERENCES

1. E Pickwell and V P Wallace "Biomedical applications of terahertz technology", J. Phys. D: Appl. Phys. 39 R301-R310 (2006)
2. Nicholas Karpowicz, Hua Zhong, Cunlin Zhang, a! Kuang-I Lin, b! Jenn-Shyong Hwang, b, Jingzhou Xu, and X.-C. Zhang, "Compact continuous-wave subterahertz system for inspection applications" APPLIED PHYSICS LETTERS 86, 054105 (2005)
3. S. Preu, G. H. Döhler, S. Malzer, L. J. Wang, and A. C. Gossard, "Tunable, continuous-wave Terahertz photomixer sources and applications" J. Appl. Phys. 109, 061301 (2011)
4. Namje Kim, Jaeheon Shin, Eundeok Sim, Chul Wook Lee, Dae-Su Yee, Min Yong Jeon, Yudong Jang, and Kyung Hyun Park, "Monolithic dual-mode distributed feedback semiconductor laser for tunable continuous wave terahertz generation" OPTICS EXPRESS, Vol. 17, No. 16, 3 Aug. 2009.
5. Sushil Kumar, "Recent Progress in Terahertz Quantum Cascade Lasers", IEEE JOURNAL OF SELECTED TOPICS IN QUANTUM ELECTRONICS, VOL. 17, NO. 1, January/February 2011
6. M. Fischer, G. Scalari, Ch., Walther, J. Faist, "Terahertz quantum cascade lasers based on In0.53Ga0.47Al0.48As/InP", Journal of Crystal Growth 311 (2009) 1939-1943
7. H. Ahmad, A. A. Latif, M. Z. Zulki°, N. A. Awang, and S. W. Harun, "High power dual-wavelength tunable fiber laser in linear and ring cavity configurations", CHINESE OPTICS LETTERS, Jan. 10, 2012
8. Anselm J. Deninger & A. Roggenbuck & S. Schindler & S. Preu, "2.75 THz tuning with a triple-DFB laser system at 1550 nm and InGaAs photomixers" Infrared Milli Terahz Waves, 36:269-277, (2015).
9. Mohammad Reza K. Soltanian, Iraj Sadegh Amiri, S. Ehsan Alavi, and Harith Ahmad, "Dual-Wavelength Erbium-Doped Fiber Laser to Generate Terahertz Radiation Using Photonic Crystal Fiber", JOURNAL OF LIGHTWAVE TECHNOLOGY, VOL. 33, NO. 24, Dec. 15, 2015
10. Lianlian Dong, Fang Xie, Sen Ma, Yunzhi Wang, and Liang Chen, "Simple tunable dual-wavelength fiber laser and multiple self-mixing interferometry to large step height measurement" OPTICS EXPRESS, Vol. 24, No. 19|19 Sep. 2016
11. Shilong Pan,* Xiaofan Zhao, and Caiyun Lou, "Switchable single-longitudinal-mode dual wavelength erbium-doped fiber ring laser incorporating a semiconductor optical amplifier", OPTICS LETTERS/Vol. 33, No. 8/Apr. 15, 2008

12. Xuliang Fan, Wei Zhou, Siming Wang, Xuan Liu, Yong Wang, and Deyuan Shen, "Compact dual-wavelength thulium-doped fiber laser employing a double-ring filter" Applied Optics, Vol. 55, No. 12/Apr. 20, 2016
13. Michael Y. Frankel and Ronald D. Esman, "Optical Single-Sideband Suppressed-Carrier Modulator for Wide-Band Signal Processing" JOURNAL OF LIGHTWAVE TECHNOLOGY, VOL. 16, NO. 5, May 1998
14. B. Globich, R. J. B. Dietz, S. Nellen, T. Gobel and M. Schell, "Terahertz detectors from Be-doped low-temperature grown InGaAs/InAlAs: Interplay of annealing and terahertz performance" AIP ADVANCES 6, 125011 (2016)
15. Yuanxun Ge, Jianjun Cao, Zhenhua Shen, Yuanlin Zheng, Xianfeng Chen and Wenjie Wan, "Terahertz wave generation by plasmonic-enhanced difference-frequency generation", J. Opt. Soc. Am. B, Vol. 31, No. 7, July 2014
16. J. A. L'huillier, G. Torosyan, M. Theuer, Yu. Avetisyan, R. Beigang, "Generation of THz radiation using bulk, periodically and aperiodically poled lithium niobate." Applied Physics B
17. J. A. L'huillier, G. Torosyan, M. Theuer, Yu. Avetisyan, R. Beigang, "Generation of THz radiation using bulk, periodically and aperiodically poled lithium niobate., Part 2: Experiments" Applied Physics B

The invention claimed is:

1. A continuous optical beat laser source for generating terahertz (THz) waves comprises periodically poled lithium niobate (ppLN) crystals arranged along a predetermined direction forming a surface generally parallel to said predetermined direction; a Ti diffused region on said surface; and an array of gold nanowires on said Ti diffused region to form a gold metal-insulator-metal (MIM) element that optimizes coupling and channeling of THz radiation from said crystals into said gold nanowires, whereby a laser beam directed along said predetermined direction through said crystals causes THz radiation to be emitted from said array of gold nanowires.

2. A continuous optical beat laser source for generating terahertz waves as defined in claim 1, wherein each crystal is approximately 27 μm thick, approximately 60 μm high and approximately 60 μm wide.

3. A continuous optical beat laser source for generating terahertz waves as defined in claim 1, wherein said nanowires project approximately 150 nm above said Ti diffused region.

4. A continuous optical beat laser source for generating terahertz waves as defined in claim 1, wherein adjacent nanowires are spaced from each other a distance of approximately 60 nm.

5. A continuous optical beat laser source for generating terahertz waves as defined in claim 1, wherein said nanowires have a width of approximately 350 nm.

6. A continuous optical beat laser source for generating terahertz waves as defined in claim 1, wherein said crystals have a generally square cross-section in planes normal to said predetermined direction.

7. A continuous optical beat laser source for generating terahertz waves as defined in claim 6, wherein said cross-section is approximately 60 μm×60 μm.

8. A multimode fiber THz radiator comprising a fiber core having a predetermined length and free ends arranged to receive laser beams through each free end for transmission through said fiber core; a plurality of periodically poled lithium niobate (ppLN) crystals embedded with said fiber core, each crystal being arranged along a radial direction in relation to said fiber core and forming a surface generally normal to said radial direction; a Ti diffused region on each surface of each crystal; and an array of gold nanowires on said Ti diffused region of each crystal to form a gold metal-insulator-metal (MIM) element that optimizes coupling and channeling of THz radiation from said crystals into said gold nanowires, whereby a laser beam directed into said free ends causes THz radiation to be emitted from said array of gold nanowires, each crystal being embedded within said core to expose said nanowires, whereby each embedded crystal emits THz radiation.

9. A multimode fiber THz radiator as defined in claim 8, wherein saiq crystals are substantially equally spaced from each other along said fiber core.

10. A multimode fiber THz radiator as defined in claim 8, wherein said crystals are rearranged in groups of crystals, each group being arranged in a plane substantially normal to the length direction of said fiber core and said crystals in each group being angularly offset from each other within each plane about said fiber core.

11. A multimode fiber THz radiator as defined in claim 8, wherein each group contains four crystals.

12. A multimode fiber THz radiator as defined in claim 10, wherein said crystals in each group are substantially uniformly angularly offset from each other.

13. A multimode fiber THz radiator as defined in claim 10, wherein said planes each containing a group of crystals are substantially equally spaced from each other along said fiber core.

14. A multimode fiber THz radiator system comprising a fiber core having a predetermined length and two free ends arranged to receive laser beams through each free end for transmission through said fiber core; a plurality of periodically poled lithium niobate (ppLN) crystals embedded with said fiber core, each crystal being arranged along a radial direction in relation to said fiber core and forming a surface generally normal to said radial direction; a Ti diffused region on each surface of each crystal; an array of gold nanowires on said Ti diffused region of each crystal to form a gold metal-insulator-metal (MIM) element that optimizes coupling and channeling of THz radiation from said crystals into said gold nanowires; and a laser source with dual outputs for generating two wavelengths $\lambda_1$, $\lambda_2$ to create a beat signal $\Delta\lambda_{THz}$ $\lambda2$-$\lambda2$ with each wavelength input into another one of said two free ends, whereby a laser beam directed into said free ends creates beating THz radiation to be emitted from said array of embedded crystals with exposed gold nanowires.

15. A multimode fiber THz radiator system as defined in claim 14, wherein said laser source comprises a dual-wavelength SOA-based laser.

16. A multimode fiber THz radiator system as defined in claim 14, wherein said SOA-based laser is tunable.

17. A multimode fiber THz radiator system as defined in claim 15, wherein said dual wavelength SOA-based laser includes at least two SOA channels at least one of which includes means for filtering random frequencies to select said two wavelengths $\lambda1,\lambda2$.

18. A multimode fiber THz radiator system as defined in claim 14, wherein said laser source comprises a dual-output port that generates two wavelengths in a fiber hybrid compound-ring resonator.

19. A multimode fiber THz radiator system as defined in claim 14, further comprising a cladding encasing said fiber core, said nanowires projecting radially beyond said cladding.

20. A multimode fiber THz radiator comprising a fiber core having a predetermined length and free ends arranged to receive laser beams through each free end for transmission through said fiber core; a plurality of periodically poled lithium niobate (ppLN) crystals embedded with said fiber core, each crystal being arranged along a radial direction in relation to said fiber core and forming a surface generally normal to said radial direction; a Ti diffused region on each surface of each crystal; an array of gold nanowires on said Ti diffused region of each crystal to form a gold metal-insulator-metal (MIM) element that optimizes coupling and channeling of THz radiation from said crystals into said gold nanowires; and a cladding encasing said fiber core, said nanowires radially projecting beyond said cladding, whereby a laser beam directed into said free ends causes THz radiation to be emitted from said array of gold nanowires, each crystal being embedded within said core to expose said nanowires, whereby each embedded crystal emits THz radiation.

* * * * *